United States Patent
Wang et al.

(10) Patent No.: US 8,384,149 B2
(45) Date of Patent: Feb. 26, 2013

(54) MEMORY CELL HAVING A SHARED PROGRAMMING GATE

(75) Inventors: Shih Wei Wang, Hsinchu (TW);
Te-Hsun Hsu, Hsinchu (TW);
Hung-Cheng Sung, Hsinchu (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 561 days.

(21) Appl. No.: 11/785,608

(22) Filed: Apr. 19, 2007

(65) Prior Publication Data

US 2008/0258200 A1    Oct. 23, 2008

(51) Int. Cl.
*H01L 29/788* (2006.01)

(52) U.S. Cl. .................................. 257/316; 257/E29.3

(58) Field of Classification Search .................. 257/316, 257/317, E29.302–E29.305; 438/259
See application file for complete search history.

(56) References Cited

U.S. PATENT DOCUMENTS

| | | | |
|---|---|---|---|
| 5,468,663 A * | 11/1995 | Bertin et al. .................. | 438/259 |
| 6,370,064 B1 * | 4/2002 | Kim ......................... | 365/185.29 |
| 2004/0253787 A1 * | 12/2004 | Lee et al. ...................... | 438/257 |
| 2008/0070363 A1 * | 3/2008 | Mokhlesi ...................... | 438/266 |

FOREIGN PATENT DOCUMENTS

CN     1189919 A    8/1998

OTHER PUBLICATIONS

Dana Lee et al., "Vertical Floating-Gate 4.5 F2 Split-gate NOR Flash Memory at 110nm Node", 2004 Symposium on VLSI Technology, pp. 72-73.

* cited by examiner

*Primary Examiner* — Tucker Wright
(74) *Attorney, Agent, or Firm* — Finnegan, Henderson, Farabow, Garrett & Dunner, LLP

(57) ABSTRACT

A semiconductor memory device includes a substrate, and a trench formed in the substrate. First and second floating gates, each associated with corresponding first and second memory cells, extend into the trench. Since the trench can be made relatively deep, the floating gates may be made relatively large while the lateral dimensions of the floating gates remains small. Moreover, the insulator thickness between the floating gate and a sidewall of the trench where a channel region is formed can be made relatively thick, even though the lateral extent of the memory cell is reduced. A programming gate extends into the trench between the first and second floating gates, and is shared, along with a source region, by the two memory cells.

12 Claims, 9 Drawing Sheets

MEMORY CELL HAVING A SHARED PROGRAMMING GATE

FIELD OF THE INVENTION

The present invention is directed toward a semiconductor memory device. In particular, the present invention is directed toward a semiconductor memory device having a floating gate structure.

BACKGROUND OF THE INVENTION

Conventional electrically erasable and programmable (EEPROM) memory devices are known, and include source and drain regions laterally spaced from one another in a substrate. These memory devices also include an electrically isolated or floating gate spaced from a portion of the substrate between the source and drain regions by an insulating layer. A programming gate is then formed over the floating gate.

Upon application of appropriate biases to the programming gate, as well as the source and drain regions, charges are selectively induced onto the floating gate, thereby programming the EEPROM memory device. In the presence of such charge, current may be inhibited from flowing between the source and drain regions, while the absence of charge may permit current flow. By detecting the presence of absence of current flowing through the EEPROM memory cell, a high '1' bit or low '0' bit, for example, can be read or sensed by known external circuitry.

In order to increase device density and improve memory capacity, there has been a trend in the art to make EEPROM memory devices smaller, such that dimensions of each structure in the device, including the floating gate, are preferably reduced. Reducing the channel length of the device, however, may induce punch through breakdown during programming operations, because a high source voltage, e.g., in excess of 4.5 V, is typically applied during such operations In addition, in conventional EEPROM cells, having either a split or stacked gate structure, charge in the channel can travel substantially linearly between the source and drain. During programming using either Source Side Hot Electron ("SSHE") injection or Channel Hot Electron ("CHE") injection, the momentum and the travel direction of the charge must be changed so that a sufficient amount of charge is injected into the floating gate instead of flowing to the drain. The channel length of the floating gate, however, is relatively short (>0.1 um), and, thus, with voltages typically applied to the memory cell during programming, the resulting change in momentum and travel direction of the charge may be insufficient to direct enough charge to the floating gate to adequately program the device. As a result, relatively low programming efficiencies are obtained (e.g. <1E-6 for CHE). Such low programming efficiency is likely to be found in devices having a planar structure (i.e., not formed in a groove or trench). High voltages are often required in order to keep programming efficiency in scaled memory cells having floating gates with shorter channel lengths. Such high voltages, however, prevent the scale down of channel length and result in the high power consumption.

In an article to Lee et al. ("Vertical Floating-Gate 4.5 F2 Split-Gate NOR Flash Memory at 110 nm NODE," 2004 SYMPOSIUM ON VLSI TECHNOLOGY, PP. 72-73.), a split gate cell structure is described having a vertical floating gate channel provided in a trench formed in a substrate. As a result, the planar area occupied by this device on the surface of the substrate was reduced. Also, programming efficiency was increased by using ballistic injection. However, the device disclosed in the Lee article requires a large common source voltage to provide an adequate coupling voltage to the floating gate and a sufficient potential drop for ballistic injection. It appears to the inventors of the present application that the device disclosed in Lee et al. may also suffer from punch through, which may limit scalability of the word line channel.

The present invention is directed toward overcoming one or more of the shortcomings in the prior art.

SUMMARY OF THE INVENTION

Consistent with an aspect of the present invention, a semiconductor memory device is provided which comprises a semiconductor substrate of a first conductivity type having a recessed portion, the recessed portion having first and second sidewalls and a bottom surface joining the first and second sidewall surfaces. The semiconductor memory device also includes first, second, and third regions provided in the semiconductor substrate. The first, second and third regions have a second conductivity type opposite the first conductivity type, and the recessed portion is provided between the first and second regions. The third region extends along the bottom surface of the recessed portion. A first floating gate is provided in the recessed portion proximate the first sidewall, and a second floating gate is provided in the recessed portion proximate the second sidewall. The semiconductor memory device further includes an electrode having at least a portion provided in the recessed portion between the first and second floating gates. The electrode is insulated from the bottom surface of the recessed portion and the first and second floating gates.

Consistent with an additional aspect of the present invention, a semiconductor memory device is provided which comprises a first transistor having a floating gate, and a second transistor having a floating gate. The semiconductor device also includes a source, which is common to the first and second transistors, and a programming gate electrode, which is common to the first and second transistors. The programming gate electrode is electrically isolated from the source. In addition, the semiconductor device includes a biasing circuit configured to selectively apply a bias to the programming gate electrode.

The accompanying drawings, which are incorporated in and constitute a part of this specification, illustrate several embodiments of the invention and together with the description, serve to explain the principles of the invention.

DETAILED DESCRIPTION

Consistent with aspects of the present invention, an embodiment of a semiconductor memory device is disclosed which includes a substrate, and a trench formed in the substrate. In addition, first and second floating gates, each associated with corresponding first and second memory cells, extend into the trench. Since the trench can be made relatively deep, the floating gates may be made relatively large in a direction extending into the substrate, while the lateral dimensions of the floating gates in a direction parallel to the substrate surface remains small. Thus, the floating gates occupy relatively little area on the surface of the substrate. Moreover, the insulator thickness between the floating gate and a sidewall of the trench where a channel region is formed can be made relatively thick, even though the lateral extent of the memory cell is reduced. As a result, memory cell density can be increased while maintaining adequate performance. Also, a programming gate extends into the trench between the first and second floating gates, and is shared, along with a source region, by the first and second memory cells. Accordingly, the semiconductor memory device of the disclosed embodiment has fewer programming gates and source regions, and thus the size of each memory cell can be reduced further, thereby further contributing to increased memory cell density.

Reference will now be made in detail to exemplary embodiments of the invention, which are illustrated in the accompanying drawings. Wherever possible, the same reference numbers will be used throughout the drawings to refer to the same or like parts.

Figure 1:
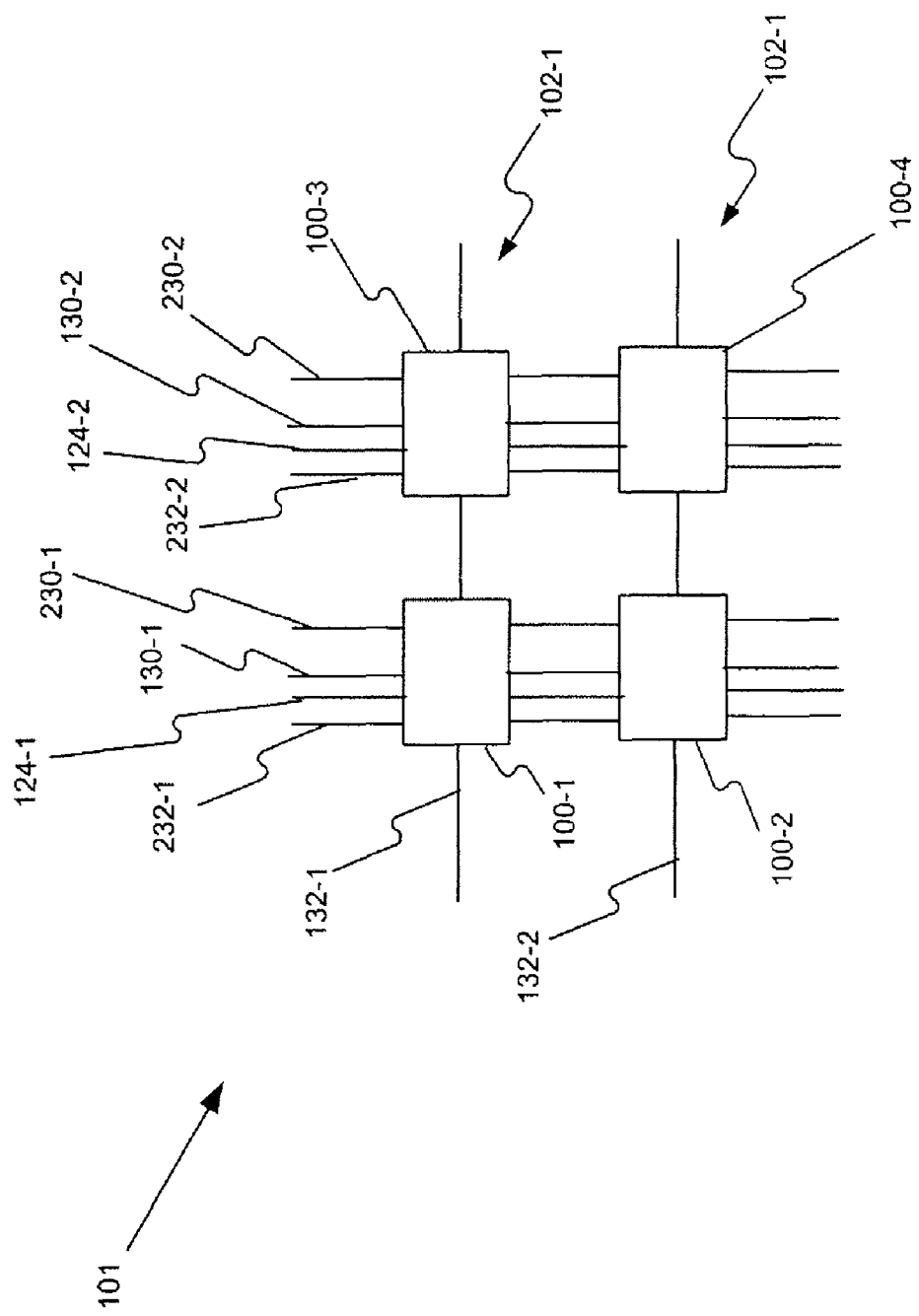
FIG. 1 illustrates a memory array portion consistent with an aspect of the present invention.

Consistent with an aspect of the present invention, a plurality of semiconductor memory devices are arranged in an array. For ease of illustration, an exemplary array portion 101 including four semiconductor memory devices 100-1 to 100-4 is shown in FIG. 1. Each of memory devices 100-1 to 100-4 preferably includes a pair of memory cells, as discussed in greater detail below. Word line 132-1 connects to each memory device in row 102-1, for example, memory devices 100-1 and 100-3, and word line 132-2 connects to each memory device in row 102-2, for example, memory devices 100-2 and 100-4. Bit lines 232-1 and 232-2 connect to a first and second columns of memory devices, respectively. The first column includes memory devices 100-1 and 100-2 and the second column includes memory devices 100-3 and 100-4. Each column of memory devices is coupled to a source line, a programming gate and a pair of bit lines. For example, memory devices 100-1 and 100-2 are coupled to bit lines 232-1 and 230-1, source line 124-1 and programming gate 130-1. In addition, memory device 100-3 and 100-4 are coupled to bit lines 232-2 and 230-2, source line 124-2 and programming gate 130-2. As further shown in FIG. 1, bit line 232-1, bit line 230-1, source line 124-1 and programming gate 130-1 extend parallel to one another in a first direction, while word line 132-1 extends in a second direction different than the first direction. Typically, the first direction is substantially perpendicular to the second direction.

As discussed in greater detail below, each memory device typically includes two memory cells having corresponding bit lines. Each pair of memory cells, however, shares a common source line and programming gate.

Figure 2:
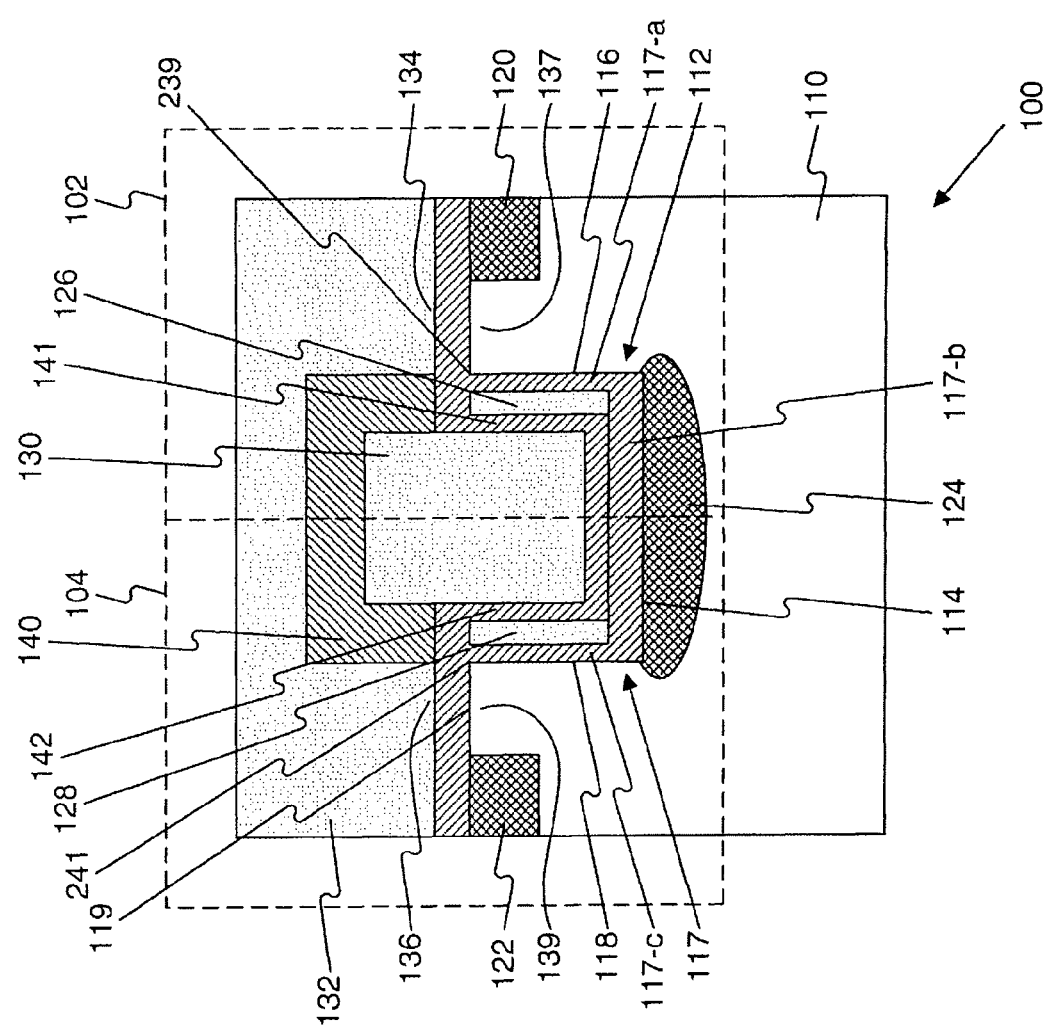
FIG. 2 illustrates a cross-sectional view of a semiconductor memory device consistent with an aspect of the present invention.

FIG. 2 illustrates a cross-sectional view of a semiconductor memory device 100, corresponding to, for example, one of memory devices 100-1 to 100-4. Semiconductor memory 100 includes memory cells 102 and 104 provided on a substrate 110 made of silicon, for example, and having a first or p-conductivity type. A recessed portion or trench 112 is formed in substrate 110. Trench 112 has a bottom surface 114 and first (116) and second (118) sidewalls. In addition, trench 112 is provided between first region or drain 120 and second region or drain 122. Drains 120 and 122 are associated with first (102) and second (104) memory cells, respectively, and each has a second or n-conductivity type. A third region or source 124 is formed along bottom surface 114 of trench 112, and is shared between memory cells 102 and 104. Source 124 also has the second or n-conductivity type.

An insulating film 117, typically including a silicon oxide, is provided on a surface 119 of substrate 110, as well as on sidewalls 116 and 118 and bottom surface 114 of trench 112. For convenience of explanation, insulating film 117 is illustrated as including insulating film portions 117-a, 117-b, and 117-c. First (126) and second (128) floating gates, typically including a conductive material such as appropriately doped polysilicon, are provided on insulating film portions 117-a and 117-c, respectively, and extend into trench 112 substantially parallel and adjacent to corresponding first (116) and second (118) sidewalls. As further shown in FIG. 1, first floating gate 126 is spaced closer to drain 120 than to drain 122, and second floating gate 128 is spaced closer to drain 122 than to drain 120. Preferably, floating gate 126 of memory cell 102 is physically isolated from floating gate 128 of memory cell 104.

As further shown in FIG. 2, a programming gate 130, typically made of a conductive material such as appropriately doped polysilicon, also extends into trench 112 and is shared by memory cells 102 and 104. Insulating portions 117-d and 117-e are provided on opposite sides of programming gate 130 to insulate programming gate 130 from floating gates 126 and 128. Typically, insulating portions 117-d and 117-e are different than insulating film portions 117-a and 117-c.

Programming gate 130 is also electrically isolated from source 124 by insulating film portion 117-b. An additional insulating film 140 surrounds an upper portion of programming gate 130, and a conductive layer or word line 132 is provided on insulating films 117 and 140. Word line 132 has first (134) and second (136) portions insulated from and overlying first (137) and second (139) portions, respectively, of substrate 110. In particular, first word line portion 134 is spaced from first substrate portion 137 by insulating portion 117-f, and second word line portion 139 is spaced from second substrate portion 139 by insulating layer portion 117-g. Preferably, the distance from drains 120 and 122 to sidewalls 116 and 118, respectively, as well as the lengths of the first (134) and second (136) portions of word line 132 are sufficient to permit formation of a channel in portions 137 and 139 under appropriate biasing conditions, as discussed in greater detail below with reference to FIGS. 3a, 3b, 4a, 4b, 5a, and 5b.

Figure 3:
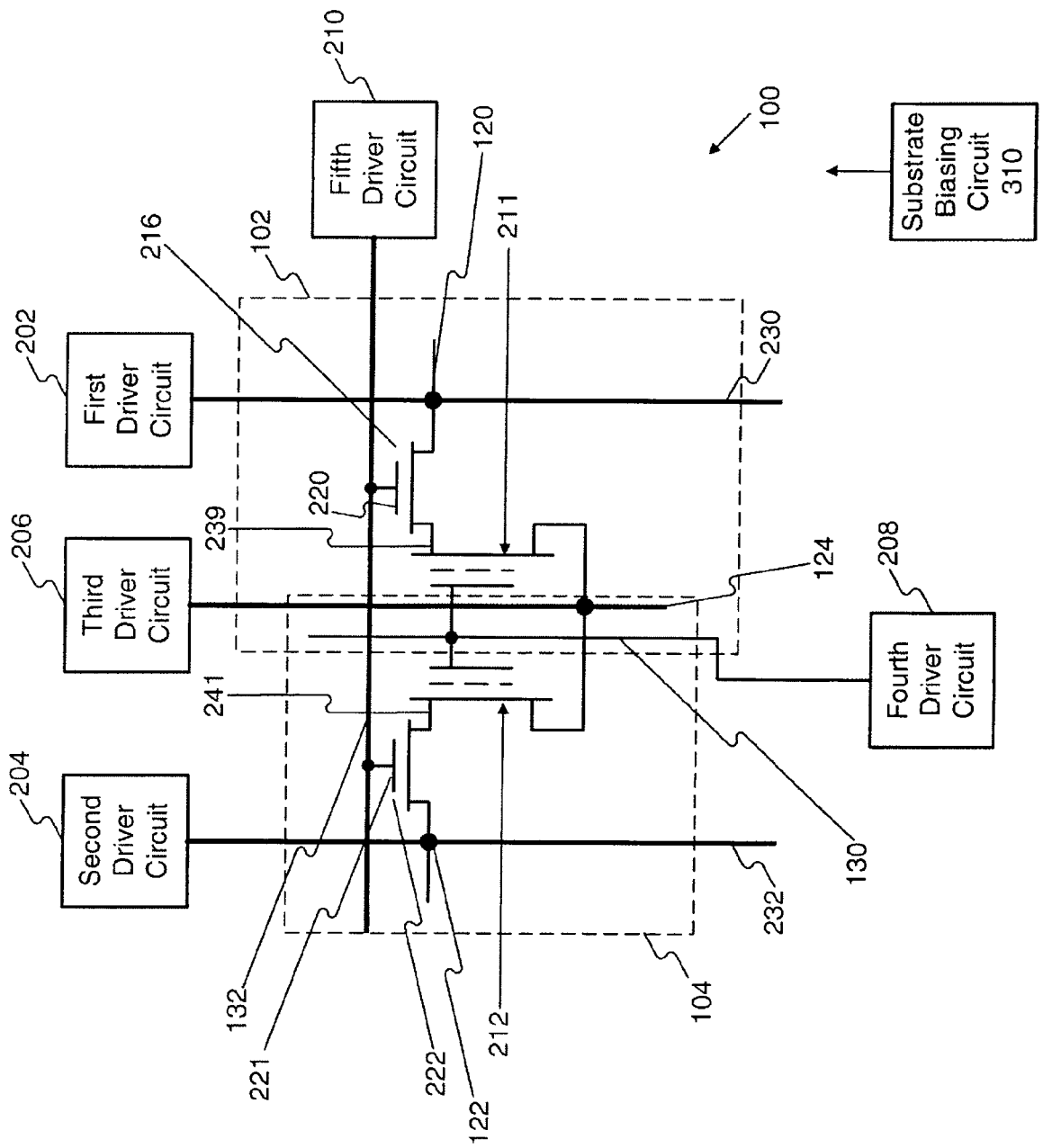
FIG. 3 illustrates a circuit schematic of a semiconductor memory device consistent with an aspect of the present invention.

FIG. 3 illustrates an equivalent circuit schematic of the structure shown in FIG. 2. In particular, FIG. 3 shows memory cell 102 including a floating gate transistor 211 and a transistor 216, and memory cell 104 having a floating gate transistor 212 and a transistor 2211, 212, 216, and 222 constitute first, second, third, fourth transistors, respectively, formed on substrate 100.

As further shown in FIG. 3, floating gate transistors 211 and 212 share source 124 as a common source electrode and share programming gate 130 as a common programming electrode. Electrodes 124 and 130 extend substantially parallel to one another, and both are substantially perpendicular to word line 132.

Consistent with an aspect of the present invention, in the array structure shown in FIG. 1, with cells shown in FIG. 2, source line 124, programming gate 130, and drains 122 and 120 (corresponding to bit lines 230 and 232, respectively, see discussion below), are parallel to each other. In addition, wordline 132 crosses source line 124, programming gate 130, drain 122, and drain 120. Accordingly, the memory array consistent with the present disclosure has a smaller size compared to that of a conventional NOR array in which separate bit line contacts are required for each cell.

With reference also to FIG. 2, in the presence of a channel in region 239 of substrate 110 adjacent an upper edge of first floating gate 126, the channel constitutes a drain of floating gate transistor 211, and a channel in region 241 constitutes a drain of floating gate transistor 212. Regions 239 and 241 also constitute a source of transistors 216 and 222, respectively. As a result, when transistors 211 and 216 are turned on, the channels formed in these devices are electrically connected to one another (see FIG. 3).

Transistors 216 and 222 also include portions 134 and 136 of word line 132 (see FIG. 2), which constitute gates 220 and 221, respectively (see FIG. 3). Transistors 216 and 222 also include drains 120 and 122 (see FIG. 2), which also constitute portions of bit lines 230 and 232, respectively.

Driver circuits shown in FIG. 3 are also provided for applying appropriate biases during operation of semiconductor memory device 100. In particular, first (202) and second (204) driver circuits are provided for selectively biasing bit lines 230 and 232, respectively. Bit lines 230 and 232 may also be connected to known sense amplifier circuits for detecting data stored in memory cells 102 and 104, respectively. A third driver circuit 206 is coupled to source 124, and a fourth driver circuit 208 is coupled to programming gate electrode 130. A fifth driver circuit 210, which may include a known row decoder circuit, is coupled to word line 132, and a substrate biasing circuit 250 is coupled to selectively bias semiconductor substrate 110.

Various modes of operation of semiconductor memory device 100 will next be described with reference to FIGS. 4a, 4b, 5a, 5b, 6a, and 6b.

A programming mode of operation of second memory cell 104 of semiconductor memory device 100 will first be described with reference to FIGS. 4a and 4b, which illustrate cross-sectional and schematic views of semiconductor memory device 100 corresponding to FIGS. 2 and 3, respectively. During the programming mode, fifth driver circuit 210 applies a bias voltage, for example, 1~1.5 V, to word line 132. Bit line 232 may be set to 0~0.5V by second driver circuit 204 while bit line 230 may be set to 1.5~3.3 V by first driver circuit 202. In addition, source 124 and programming gate 130 are maintained at a potential of 3.5~4.5V and 6~10 V by third driver circuit 206 and fourth driver circuit 208, respectively. Further, substrate biasing circuit 250 applies a potential of 0 V to substrate 110.

Figure 4A:
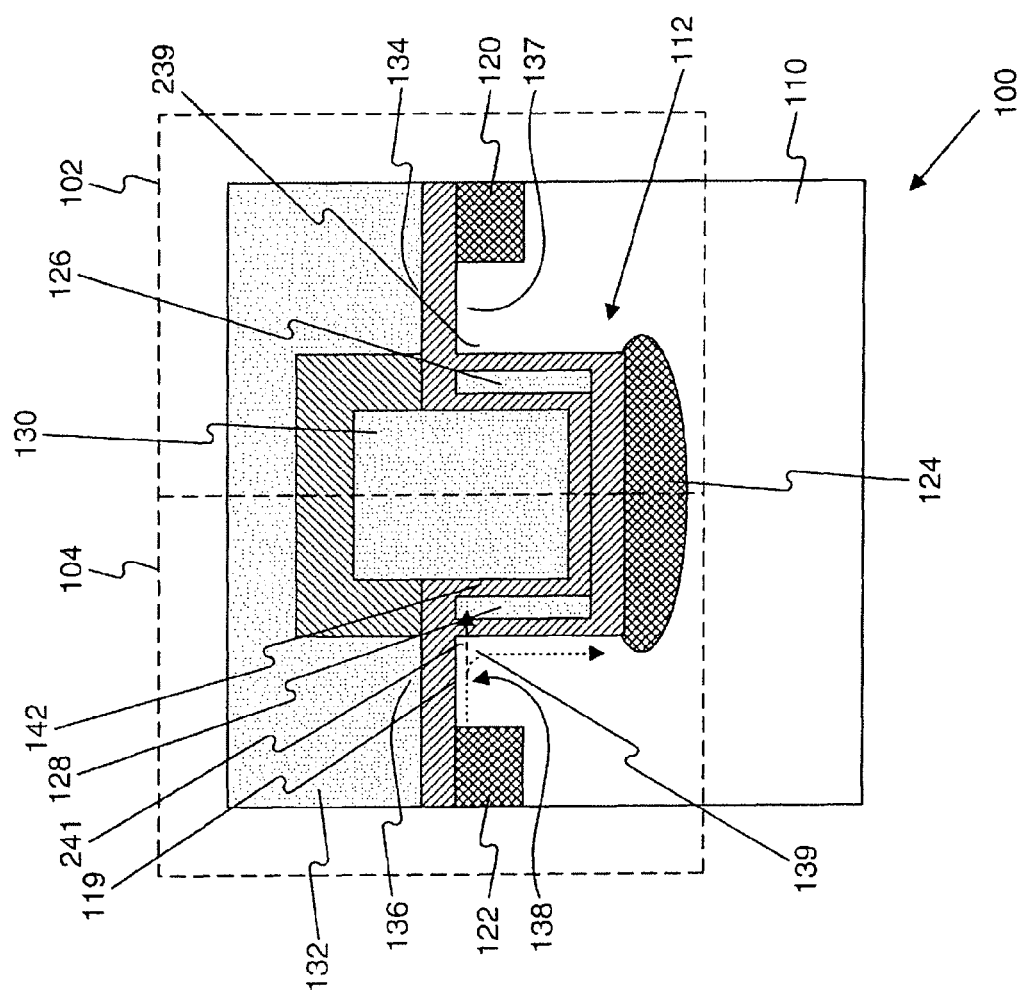
FIGS. 4a and 4b illustrate a cross-sectional view and a circuit schematic, respectively, of a semiconductor memory device during a programming operation consistent with an additional aspect of the present invention.
Figure 4B:
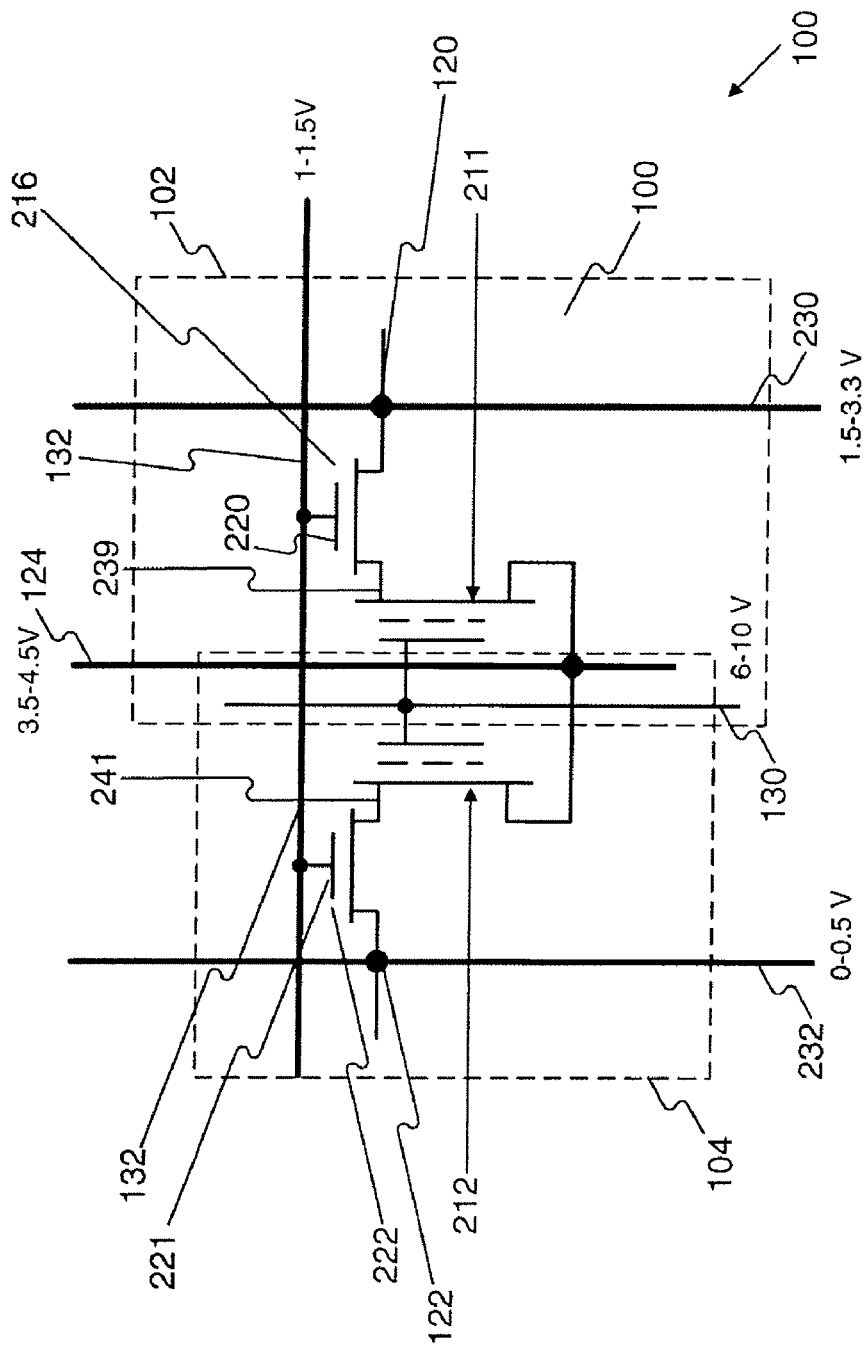

Under these conditions, a channel 138 is formed in second memory cell 104, as represented by a dotted arrow in FIG. 4a. In particular, electrons, for example, from drain 122 flow into substrate portion 139 beneath second portion 136 of word line 132 to create channel 138. In addition, due to the elevated potential on programming gate electrode 130, further inversion occurs along sidewall 118 of trench 112 such that channel 138 extends downward into substrate 110 toward source 124. On the other hand, programming gate 130 will provide sufficient voltage coupling to floating gate 128. As a result, some electrons flowing from drain 122 are sufficiently energetic to pass through insulating film 117-c and are injected onto second floating gate 128 through a known ballistic transport process. These ballistic electrons are then stored on second floating gate 128, thereby programming second memory cell 104.

In memory cell 102, however, a bias of 1.5~3.3 V is applied to drain 120. As a result, no channel is formed in region 137 and gate 126 of memory cell 102 is not programmed.

Therefore, by selectively applying appropriate biases to the drains of the memory cells consistent with the present invention, in combination with appropriate word line and programming gate electrode biasing, one memory cell of the memory device may be programmed while the other is not. Such programming can be achieved, even though both memory cells share the same programming gate electrode.

Figure 5A:
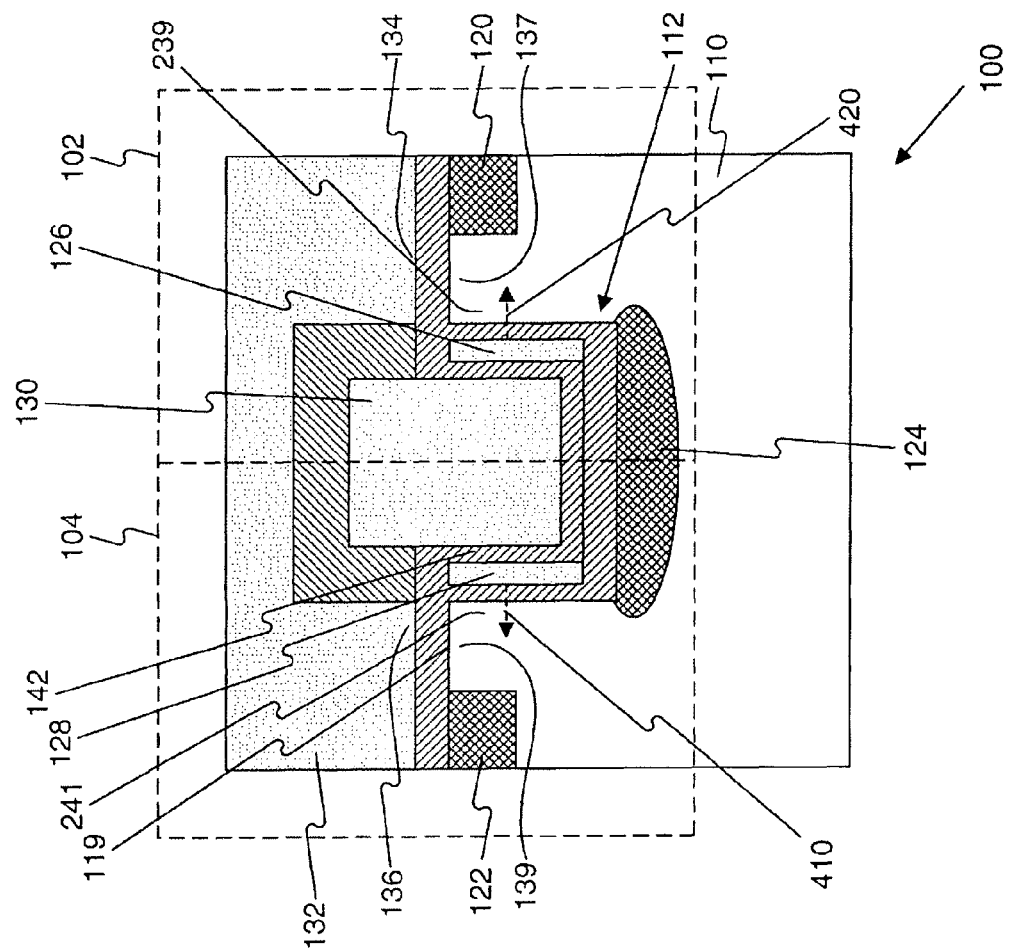
FIGS. 5a and 5b illustrate a cross-sectional view and a circuit schematic, respectively, of a semiconductor memory device during an erase operation consistent with another aspect of the present invention.
Figure 5B:
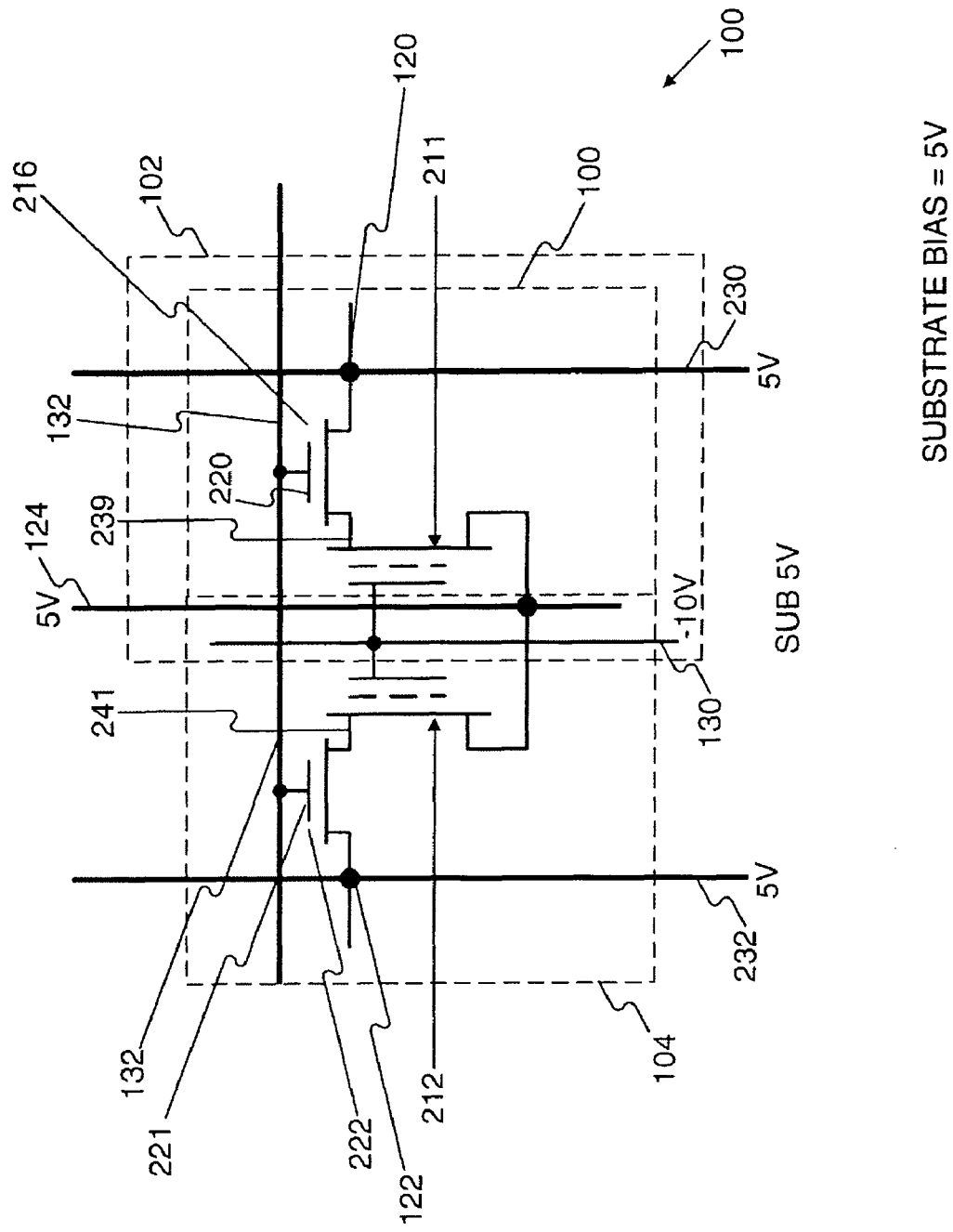

An erase operation will next be described with reference to FIGS. 5a and 5b. During the erase operation, exemplary voltages applied to first bit line 230 (by first driver circuit 202), second bit line 232 (by second driver circuit 204), source 124 (by third driver circuit 206), programming gate electrode 130 (by fourth driver circuit 208), word line 132 (by fifth driver circuit 210), and substrate 110 (by substrate biasing circuit 250) are listed in Table I (see also FIG. 5b).

TABLE I

| First Bit Line 230 | Second Bit Line 232 | Source 124 | Programming Gate Electrode 130 | Word Line 132 | Substrate 110 |
|---|---|---|---|---|---|
| 5 V | 5 V | 5 V | −10 V | 0 V | 5 V |

Under the biasing conditions set forth in Table I, a relatively strong electric field is created between programming gate electrode 130 and substrate 110. As a result, any carriers, e.g., electrons, present on first (126) and second (128) floating gates, are discharged into substrate 110 as represented by dashed arrows 410 and 420 in FIG. 5a. As a result, charge is removed by Fowler-Nordheim tunneling from the first (126) and second (128) floating gates, and memory cells 102 and 104 are erased.

Figure 6A:
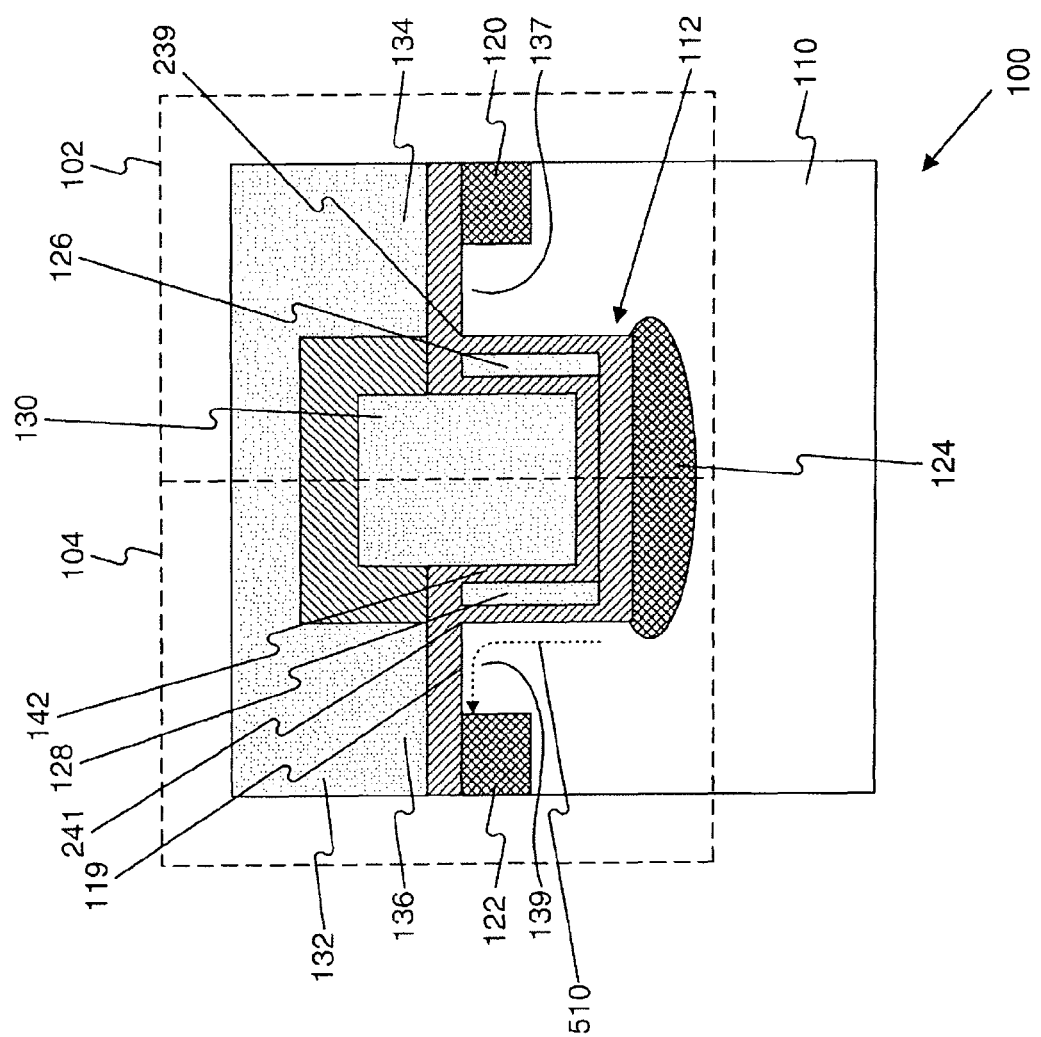
FIGS. 6a and 6b illustrate a cross-sectional view and a circuit schematic, respectively, of a semiconductor memory device during a read operation consistent with another aspect of the present invention.
Figure 6B:
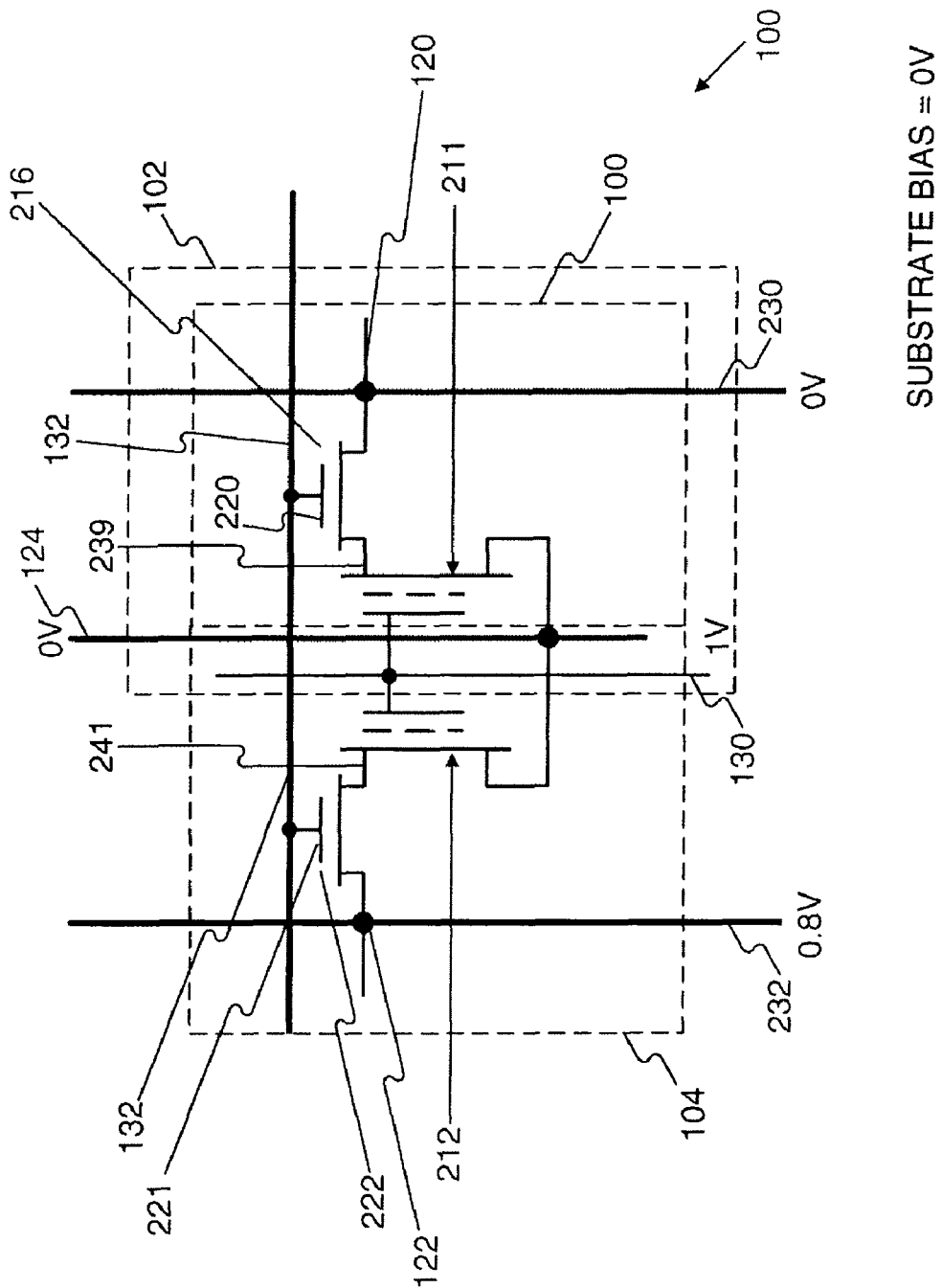

A read operation of second memory cell 104 will next be described with reference to FIGS. 6a and 6b. Table II lists exemplary voltages applied during the read operation of second memory cell 104.

TABLE II

| First Bit Line 230 | Second Bit Line 232 | Source 124 | Programming Gate Electrode 130 | Word Line 132 | Substrate 110 |
|---|---|---|---|---|---|
| 0 V | 0.8 V | 0 V | 1 V | 1.5 V | 0 V |

Reading a '0' bit from second memory cell 104 will first be described. Assuming that little or no charge is stored in second floating gate 128 (corresponding to a '0' bit), application of 1.5V and 1.0V to word line 132 and programming gate electrode 130, respectively, induces a channel 510 between source 124 and drain 122. Since drain 122 is at a higher potential (0.8V) than source 124 (0V) current flows between these two regions in substrate 110. As a result, the potential of drain 122 and thus bit line 232 is pulled to ground (0V), thereby representing a low or '0' bit stored in memory cell 104.

If, however, charge is stored on second floating gate 128, thereby representing storage of a high or '1' bit, for example, the threshold voltage of floating gate transistor 212 is increased. Accordingly, even though the potential on floating gate electrode 128 is relatively high, it is insufficient to invert the substrate adjacent second sidewall 118. Thus, there is no current path between source 124 and drain 122, such that drain 122 remains floating and its potential remains at 0.8V. This potential is then sensed on second bit line 232 as a high or '1' bit.

It is noted that during the read operation of second memory cell 104, the potential of drain 120 of first memory cell 102 is set to the same voltage as that of source 124, namely, 0V. Accordingly, regardless of the presence or absence of charge on first floating gate 126, no current flows between source 124 and drain 120 so that first memory cell 102 is deselected while data is read from second memory cell 104.

Accordingly, by application of appropriate biases to drains 120 and 122 through bit lines 230 and 232, respectively, data can be selectively read from either memory cell 102 or 104 even though each shares a common programming gate electrode 130 and word line 132.

As noted above, a semiconductor memory device is provided which has memory cells that share a common programming gate electrode and word line. In addition, the programming gate electrode extends into the surface of the substrate. As a result, a memory cell having a reduced size and improved density can be achieved.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor memory device including a first memory cell having a first floating gate and a second memory cell having a second floating gate, comprising:
    a semiconductor substrate having a contiguously formed recessed portion, the recessed portion having first and second sidewalls and a bottom surface joining the first and second sidewall surfaces, the semiconductor substrate having a first conductivity type;
    first, second, and third regions provided in the semiconductor substrate, the first, second and third regions having a second conductivity type opposite the first conductivity type, the recessed portion being provided between the first and second regions, the third region extending along the bottom surface of the recessed portion;
    the first floating gate provided in the recessed portion proximate the first sidewall and being spaced closer to the first region than the second region;
    the second floating gate provided in the recessed portion proximate the second sidewall and being spaced closer to the second region than the first region;
    an electrode having at least a portion provided in the recessed portion between the first and second floating gates, the electrode being insulated from the bottom surface of the recessed portion and the first and second floating gates;
    a conductive layer, a first portion of the conductive layer being insulated from and overlying a first portion of the substrate between the first region and the first floating gate, a second portion of the conductive layer being insulated from and overlying a second portion of the substrate between the second region and the second floating gate, the first and second portions of the conductive layer, upon application of a bias to the conductive layer, inducing first and second channels in the first and second portions of the substrate, respectively;
    a first driver circuit configured to selectively apply a second potential to the first region;
    a second driver circuit configured to selectively apply a second potential to the second region;
    a third driver configured to selectively apply a third potential to the third region;
    a fourth driver circuit configured to selectively apply a fourth potential to the electrode;
    a fifth driver circuit configured to selectively apply the bias to the conductive layer; and
    a sixth driver circuit configured to selectively apply a sixth potential to the substrate,
    wherein the third region and the electrode are common to the first memory cell and the second memory cell, and
    wherein at least one of a top surface of the first floating gate and a top surface of the second floating gate is flush with a top surface of the substrate.

2. A semiconductor memory device in accordance with claim 1, wherein the first floating gate extends substantially parallel to the first sidewall and the second floating gate extends substantially parallel to the second sidewall.

3. A semiconductor memory device in accordance with claim 1, wherein each of the electrode, the first floating gate, and the second floating gate includes polysilicon.

4. A semiconductor memory device in accordance with claim 1, wherein the first channel extends from the first sidewall to the first region, and the second channel extends from the second sidewall to the second region.

5. A semiconductor memory device in accordance with claim 1, wherein the conductive layer extends in a first direction and the third region extends in a second direction different than the first direction.

6. A semiconductor memory device in accordance with claim 5, wherein the first direction is substantially perpendicular to the second direction.

7. A semiconductor memory device in accordance with claim 1, wherein the first and second floating gates each includes a conductive material, the semiconductor memory device further comprising:
    an insulative layer provided in the recessed portion, the first and second floating gates being embedded in the insulative layer.

8. A semiconductor memory device in accordance with claim 1, further comprising a driver circuit configured to selectively apply a bias to the substrate.

9. A semiconductor memory device, comprising:
    a first transistor having a first floating gate;
    a second transistor having a second floating gate;
    a source being common to the first and second transistors;
    a programming gate electrode common to the first and second transistors, the programming gate electrode being electrically isolated from the source;
    a biasing circuit configured to selectively apply a first bias to the programming gate electrode;
    a third transistor having a drain and gate;
    a fourth transistor having drain and a gate;
    a word line, the gate of the third transistor constituting a portion of word line;
    a first bit line and a second bit line, the drain of the third transistor constituting a portion of the first bit line and the drain of the fourth transistor constitutes a portion of the second bit line; and
    a semiconductor substrate, the semiconductor substrate having a contiguously formed recessed portion, wherein the first floating gate, the second floating gate, and at least a portion of the programming gate electrode are provided in the recessed portion, wherein, upon application of the first bias to the programming gate electrode and a second bias to the gate of the third transistor, carries are injected from the drain of the third transistor to the first floating gate of the first transistor, wherein, upon application of the first bias to the programming gate electrode and a third bias to the gate of the fourth transistor, carriers are injected from the drain of the fourth transistor to the second floating gate of the second transistor, and wherein at least one of a top surface of the first floating gate and a top surface of the second floating gate is flush with a top surface of the substrate.

10. A semiconductor memory device in accordance with claim 9, wherein the semiconductor memory device is provided on the semiconductor substrate having a first conductivity type, and the source includes a conductive region provided in the semiconductor substrate, the conductive region having a second conductivity type opposite the first conductivity type.

11. A semiconductor device in accordance with claim 10, wherein the conductive region extends in a first direction and the programming gate electrode extends in a second direction substantially perpendicular to the first direction.

12. A semiconductor memory device in accordance with claim 9, further comprising a driver circuit configured to selectively apply a potential to the semiconductor substrate.

* * * * *